(12) United States Patent
Ning

(10) Patent No.: US 11,462,257 B2
(45) Date of Patent: Oct. 4, 2022

(54) SEMICONDUCTOR DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/389,618

(22) Filed: Jul. 30, 2021

(65) Prior Publication Data
US 2022/0020426 A1 Jan. 20, 2022

Related U.S. Application Data

(63) Continuation of application No. PCT/CN2020/136390, filed on Dec. 15, 2020.

(30) Foreign Application Priority Data

Jul. 17, 2020 (CN) .......................... 202010689669.1

(51) Int. Cl.
G11C 11/406 (2006.01)
G11C 5/04 (2006.01)
H01L 25/065 (2006.01)

(52) U.S. Cl.
CPC .......... *G11C 11/40626* (2013.01); *G11C 5/04* (2013.01); *H01L 25/0657* (2013.01); *H01L 2225/06589* (2013.01)

(58) Field of Classification Search
CPC ....... G11C 11/40626; G11C 5/04; G11C 7/04; G11C 11/4074; G11C 11/4078; H01L 25/0657; H01L 2225/06589; G01K 15/00
See application file for complete search history.

(56) References Cited

U.S. PATENT DOCUMENTS

| 7,107,178 B2 | 9/2006 | Won |
| 7,266,031 B2 | 9/2007 | Kim |
| 7,383,149 B1 | 6/2008 | Walker |
| 7,480,588 B1 | 1/2009 | Walker |

(Continued)

FOREIGN PATENT DOCUMENTS

| CN | 101017708 A | 8/2007 |
| CN | 101162604 A | 4/2008 |

(Continued)

OTHER PUBLICATIONS

International Search Report in the international application No. PCT/CN2020/136391, dated Apr. 16, 2021, 2 pgs.

(Continued)

*Primary Examiner* — Tri M Hoang
(74) *Attorney, Agent, or Firm* — Cooper Legal Group, LLC

(57) ABSTRACT

A semiconductor device is provided, including a plurality of memory chips and a temperature detection module. The temperature detection module includes: a plurality of temperature detection units, in which the plurality of temperature detection units are disposed on at least part of the memory chips to detect the temperatures of at least part of the memory chips; and a processing unit, in which the plurality of temperature detection units share the processing unit with each other, and the processing unit is configured to process a signal of at least one of the temperature detection units.

19 Claims, 3 Drawing Sheets

(56) References Cited

U.S. PATENT DOCUMENTS

| | | |
|---|---|---|
| 7,554,869 B2 | 6/2009 | Kim |
| 7,606,099 B2 | 10/2009 | Chung |
| 7,643,889 B2 | 1/2010 | Jeong |
| 8,801,279 B2 | 8/2014 | Kim |
| 9,013,932 B1 | 4/2015 | Lee |
| 9,194,754 B2 | 11/2015 | Walker |
| 9,465,757 B2 | 10/2016 | Son et al. |
| 9,520,189 B1 | 12/2016 | Papandreou et al. |
| 9,530,766 B2 | 12/2016 | Ishihara et al. |
| 9,587,994 B2 | 3/2017 | Yayama |
| 9,927,986 B2 | 3/2018 | Hodes et al. |
| 10,679,711 B2 | 6/2020 | Matsumoto |
| 2005/0105367 A1 | 5/2005 | Kim |
| 2005/0146965 A1 | 7/2005 | Kim |
| 2006/0066384 A1* | 3/2006 | Jain ............ G11C 29/028 327/512 |
| 2006/0290366 A1* | 12/2006 | Kon ............ G01R 31/2874 324/750.06 |
| 2007/0247944 A1 | 10/2007 | Fischer |
| 2008/0018377 A1 | 1/2008 | Chung |
| 2008/0091378 A1 | 4/2008 | Jeong |
| 2009/0085647 A1* | 4/2009 | Hwang ............ G11C 7/1051 327/513 |
| 2011/0279168 A1 | 11/2011 | Lee |
| 2013/0060499 A1 | 3/2013 | Yoshimura |
| 2015/0043266 A1 | 2/2015 | Youn |
| 2015/0124544 A1 | 5/2015 | Lee |
| 2016/0133314 A1* | 5/2016 | Hwang ............ G11C 11/40611 365/189.02 |
| 2016/0141284 A1 | 5/2016 | Ishihara et al. |
| 2018/0166123 A1 | 6/2018 | Goto et al. |
| 2018/0293029 A1* | 10/2018 | Achtenberg ............ G11C 16/26 |
| 2019/0096473 A1 | 3/2019 | Park |
| 2019/0295663 A1 | 9/2019 | Matsumoto |
| 2020/0142799 A1 | 5/2020 | Hiruta |
| 2020/0159465 A1 | 5/2020 | Achtenberg et al. |
| 2020/0333194 A1* | 10/2020 | Huh ............ H01M 50/284 |
| 2021/0247241 A1 | 8/2021 | Nagata |
| 2021/0362492 A1* | 11/2021 | Gardner ............ G01K 1/026 |
| 2022/0006427 A1 | 1/2022 | Sugimoto |

FOREIGN PATENT DOCUMENTS

| | | |
|---|---|---|
| CN | 104807561 A | 7/2015 |
| CN | 105474543 A | 4/2016 |
| CN | 107393577 A | 11/2017 |
| CN | 208953151 U | 6/2019 |
| CN | 110299171 A | 10/2019 |
| CN | 212303077 U | 1/2021 |
| CN | 212303078 U | 1/2021 |
| CN | 212303079 U | 1/2021 |

OTHER PUBLICATIONS

International Search Report in the international application No. PCT/CN2020/136388, dated Apr. 8, 2021, 3 pgs.

International Search Report in the international application No. PCT/CN2020/136390, dated Apr. 16, 2021, 2 pgs.

Supplementary European Search Report in the European application No. 20937168.1, dated Jun. 13, 2022, 8 pgs.

Notice of Allowance of the U.S. Appl. No. 17/389,636, dated May 4, 2022, 19 pgs.

First Office Action of the U.S. Appl. No. 17/389,629, dated Apr. 22, 2022, 22 pgs.

* cited by examiner

SEMICONDUCTOR DEVICE

CROSS-REFERENCE TO RELATED APPLICATIONS

This is a continuation application of International Patent Application No. PCT/CN2020/136390, filed on Dec. 15, 2020, which claims priority to Chinese Patent Application No. 202010689669.1, filed on Jul. 17, 2020, entitled "Semiconductor Device". The disclosures of International Patent Application No. PCT/CN2020/136390 and Chinese Patent Application No. 202010689669.1 are incorporated by reference herein in their entireties.

TECHNICAL FIELD

The disclosure relates to the field of memories, and particularly to a semiconductor device.

BACKGROUND

A Dynamic Random Access Memory (DRAM) is a commonly used semiconductor memory device in computers, and a memory array region of the DRAM is composed of many repeated memory cells. Each of the memory cells usually includes a capacitor and a transistor. A grid electrode of the transistor is connected with a word line, a drain electrode of the transistor is connected with a bit line, and a source electrode of the transistor is connected with the capacitor. Voltage signals on the word line may control the opening or closing of the transistor, so that the data information stored in the capacitor may be read through the bit line, or the data information may be written into the capacitor through the bit line for storage.

The temperature has a relatively great influence on writing into the memory. When writing to a memory in a low-temperature environment, there are problems that the writing time is longer and the writing stability is not high.

SUMMARY

The technical problem to be solved by the disclosure is to provide a semiconductor device which may detect a temperature of a memory chip to prevent the memory chip from starting and running at a low temperature, shorten the writing time and improve the writing stability of the memory chip. Furthermore, the circuit structure of the temperature detection module is simple and easy to implement, and the temperature detection units share the processing unit with each other, so that the temperature detection module occupies a small area, and the effective area of the memory chip may not be affected.

In order to solve the above problem, according to a first aspect of the disclosure, a semiconductor device is provided, including multiple memory chips and a temperature detection circuit. The temperature detection circuit includes: multiple temperature detectors, disposed on at least part of the memory chips to detect temperatures of at least part of the memory chips; and a processor, in which the multiple temperature detectors share the processor with each other, and the processor is configured to process a signal of at least one of the temperature detectors.

Further, the processor may include multiple switches. The switches are electrically connected with the temperature detectors to select the temperature detector with a signal needing to be processed by the processor.

Further, the switches may correspond to the temperature detectors one to one.

Further, the processor may include a fixed resistor. The fixed resistor has a first terminal electrically connected with a power source and a second terminal connected with the switches.

Further, the processor may include an Analog/Digital (A/D) conversion circuit. The A/D conversion circuit has an input terminal electrically connected with the second terminal of the fixed resistor and an output terminal configured to output digital signals, and the A/D conversion circuit is configured to convert analog signals of the second terminal of the fixed resistor into digital signals.

Further, the A/D conversion circuit may include: a resistor set and multiple comparators. The resistor set has a first terminal electrically connected with the power source and a second terminal electrically connected with a grounding terminal. The resistor set has multiple leading-out terminals. Voltages of the leading-out terminals are different from each other. Signals of the input terminal of the A/D conversion circuit serve as input signals of the comparators. Signals of the multiple leading-out terminals of the resistor set respectively serve as reference signals of the multiple comparators. The comparators output digital signals.

Further, the A/D conversion circuit may include an encoder. The encoder receives and encodes the output signals of the comparators.

Further, the A/D conversion circuit may include an output device. The output device is connected with the comparators to output the digital signals.

Further, the resistor set may include multiple sub-resistors connected in series. The numbers of the sub-resistors between respective leading-out terminals of the resistor set and the second terminal of the resistor set are different from each other, so that the voltages of the respective leading-out terminals are different from each other.

Further, resistance values of the sub-resistors are the same or different.

Further, the temperature detectors may be diodes. Positive terminals of the diodes are electrically connected with the switches, and negative terminals of the diodes are electrically connected with the grounding terminal.

Further, the processor may include an adjustable resistor. The adjustable resistor is connected in parallel with the temperature detectors. The adjustable resistor has a first terminal electrically connected with the grounding terminal and a second terminal electrically connected with the second terminal of the fixed resistor.

Further, the temperature detectors may correspond to the memory chips one to one. Each of the memory chips is provided with one of the temperature detectors.

Further, the semiconductor device may include a control chip. The memory chips and the temperature detection circuit are electrically connected with the control chip.

Further, the processor is disposed on the control chip or disposed on one of the memory chips.

Further, the multiple memory chips are sequentially stacked upward on the control chip.

Further, the semiconductor device may include a circuit substrate. A connecting line is provided in the circuit substrate. Both the memory chip and the control chip are located on the circuit substrate. The memory chip is connected with the control chip through the connecting line in the circuit substrate.

Further, the control chip is configured to heat the memory chip before the memory chip is started and to determine whether the temperature detected by the temperature detector reaches a set threshold and the control chip is configured to control the memory chip to start when the temperature detected by the temperature detector reaches the set threshold.

Further, a power supply of the temperature detector and a power supply of the memory chip are implemented by different power sources.

Further, the power supply of the temperature detector is earlier than the power supply of the memory chip.

Further, the temperature detector shares a same grounding terminal with the memory chip.

DETAILED DESCRIPTION

The embodiments of the semiconductor device provided by the disclosure will be described in detail below with reference to the accompanying drawings.

As mentioned in the background, the temperature has a relatively great influence on writing into the memory. When writing into a memory in a low-temperature environment, there are problems that the writing time is longer and the writing stability is not high.

Studies have found that when an existing memory works in a low-temperature environment, the resistances of bit lines, word lines and metal connecting lines (metal contact parts) in the memory will increase due to the temperature drop, and the increase of the resistance will change or prolong the time for writing data into the memory, which affects the writing stability of the memory.

Therefore, the disclosure provides a semiconductor device which uses temperature detection units to detect the temperature of memory chips so as to provide a reference for starting and running of the memory chips, thereby preventing the memory chips from starting and running at a low temperature, shortening the writing time, and improving the writing stability of the memory chips. Furthermore, the temperature detection module of the semiconductor device of the disclosure occupies a small area, and the effective area of the memory chip may not be affected.

Figure 1:
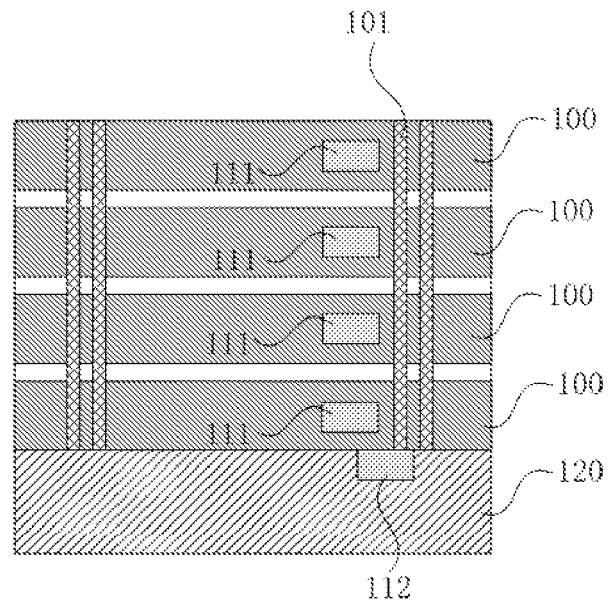
FIG. 1 is a schematic structural diagram of a semiconductor device according to a first embodiment of the disclosure.
Figure 2:
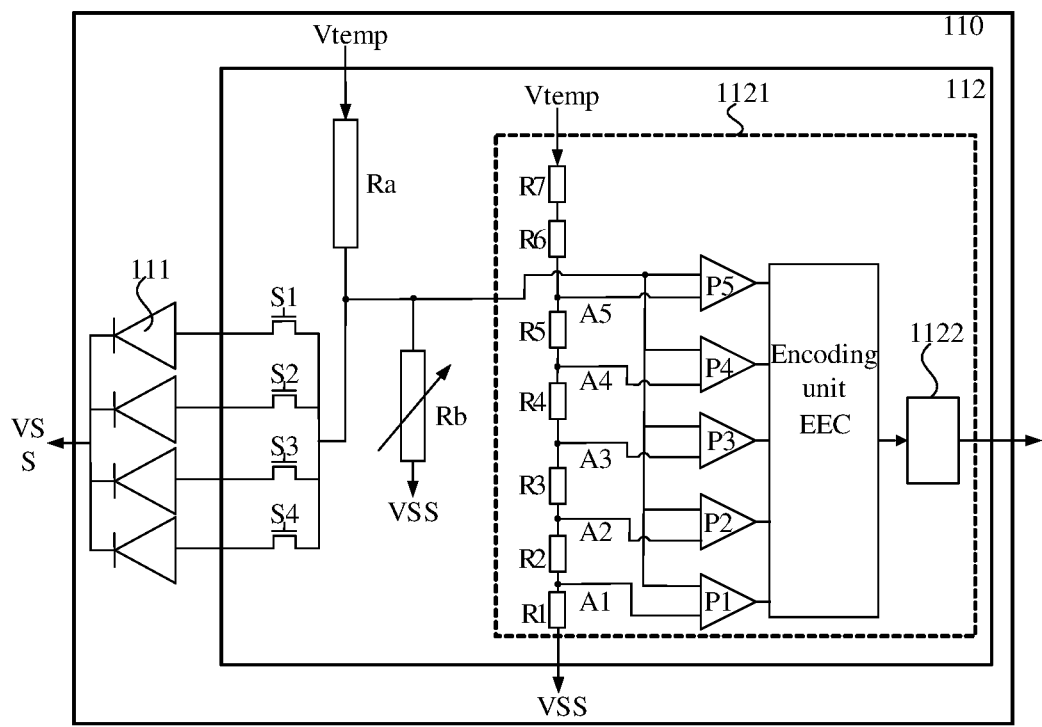
FIG. 2 is a circuit diagram of a temperature detection module in a semiconductor device of the disclosure.

FIG. 1 is a schematic structural diagram of a semiconductor device according to a first embodiment of the disclosure. FIG. 2 is a circuit diagram of a temperature detection module in the semiconductor device of the disclosure. Referring to FIG. 1 and FIG. 2, the semiconductor device of the disclosure includes multiple memory chips 100 and a temperature detection module 110.

Further, the semiconductor device includes a control chip 120, and the memory chips 100 and the temperature detection module 110 are electrically connected with the control chip 120. The control chip 120 is configured to control starting and running of the memory chips 100 and the temperature detection module 110. The starting of the memory chips 100 includes powering on and self-detecting, and the running of the memory chips 100 includes writing data into the memory chips 100, reading data from the memory chips 100 and deleting data accessible in the memory chips 100, etc. It is noted that the function of the control chip 120 in terms of controlling the starting of the memory chips 100 and the like in the embodiments of the disclosure may also be implemented by setting control circuits in the memory chips 100. In this case, the control chip 120 may not be needed. It is understood by those of ordinary skill in the art that it can be set according to needs.

The memory chip 100 is an existing memory into which the data can be written, from which the data can be read and/or from which the data can be deleted. The memory chip 100 is formed through a semiconductor integrated manufacturing process. Specifically, the memory chip 100 may include a memory array and a peripheral circuit connected with the memory array. The memory array includes multiple memory cells and bit lines, word lines and metal connecting lines (metal contact parts) connected with the memory cells. The memory cells are configured to store data, and the peripheral circuit is a related circuit when the memory array is operated. In the present embodiment, the memory chip 100 is a DRAM memory chip. The DRAM memory chip includes multiple memory cells, each of the memory cells usually includes a capacitor and a transistor. A grid electrode of the transistor is connected with a word line, a drain electrode of the transistor is connected with a bit line, and a source electrode of the transistor is connected with the capacitor. In other embodiments, the memory chips 100 may be other types of memory chips.

The temperature detection module 110 includes multiple temperature detection units 111 and a processing unit 112.

The multiple temperature detection units 111 are disposed on at least part of the memory chips 100 to detect temperatures of at least part of the memory chips 100 and output analog signals corresponding to the temperatures. When the temperature detected by the temperature detection unit 111 reaches a set threshold, the control chip 120 controls the memory chip 100 to start. The specific value of the set threshold may be set according to actual needs or experiences. In the present embodiment, the temperature detection units 111 are diodes.

There may be a one-to-one correspondence or a one-to-many correspondence between the temperature detection units 111 and the memory chips 100.

When multiple memory chips 100 are provided, multiple temperature detection units 111 are provided and the number of the temperature detection units 111 is the same as the number of the memory chips 100, the temperature detection units 111 and the memory chips 100 have a one-to-one correspondence with each other. That is, one temperature detection unit 111 is disposed in one memory chip 100 and is configured to detect the temperature of the memory chip 100. Specifically, in the present embodiment, multiple memory chips 100 are provided, and multiple temperature detection units 111 are provided, as shown in FIG. 1. FIG. 1 schematically shows four memory chips 100 and four temperature detection units 111, the multiple memory chips 100 are stacked on each other, and the temperature detection units 111 correspond to the memory chips 100 one to one and are configured to detect the temperatures of the memory chips 100.

When multiple memory chips 100 are provided and multiple temperature detection units 111 are provided, but the number of the temperature detection units 111 is less than the number of the memory chips 100, the temperature detection units 111 and the memory chips 100 may possibly have both a one-to-one correspondence with each other and a one-to-many correspondence with each other, or only have a one-to-many correspondence with each other. That is, there may be a case where one temperature detection unit 111 only detects the temperature of one memory chip 100 and one temperature detection unit 111 detects the temperatures of multiple memory chips 100, or there may be only a case where one temperature detection unit 111 detects the temperatures of multiple memory chips 100.

Figure 3:
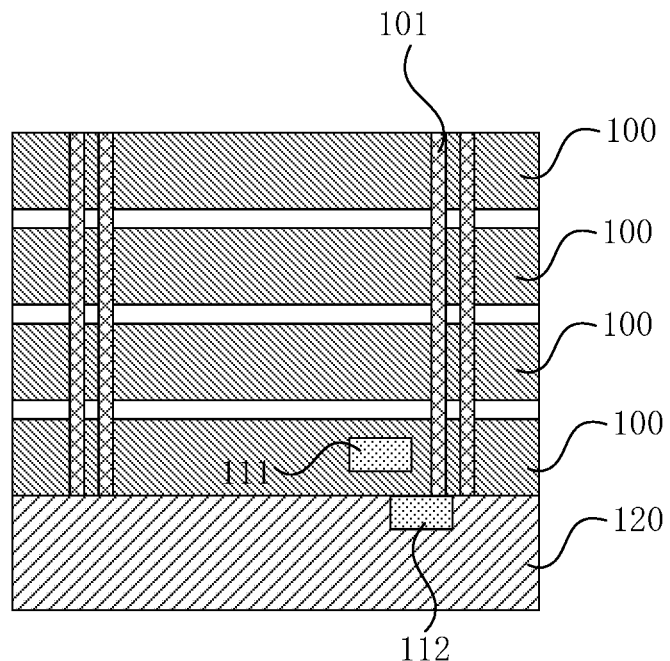
FIG. 3 is a schematic structural diagram of a semiconductor device according to a second embodiment of the disclosure.

Further, the temperature detection unit 111 may be formed in the memory chip 100 through a semiconductor integrated manufacturing process. When the temperature detection unit 111 is configured to only detect the temperature of one memory chip 100, the temperature detection unit 111 may be formed in the memory chip 100. For example, in the present embodiment, as shown in FIG. 1, the temperature detection units 111 correspond to the memory chips 100 one to one. That is, each of the memory chips 100 is disposed with one temperature detection unit 111. When the temperature detection unit 111 is configured to detect the temperatures of multiple memory chips 100, the temperature detection unit 111 may be formed in any one of the multiple memory chips 100 or formed in the middle or bottommost memory chip 100. For example, in a second embodiment of the disclosure, as shown in FIG. 3 which is a schematic structural diagram of a semiconductor device according to the second embodiment of the disclosure, the temperature detection unit 111 is disposed in the bottommost memory chip 100, and may measure the temperatures of four memory chips 100.

The multiple temperature detection units 111 share the processing unit 112 with each other, and the processing unit 112 is configured to process a signal of at least one of the temperature detection units 111.

The multiple temperature detection units 111 of the semiconductor device of the disclosure share the processing unit 112 with each other, so that the occupied area of the temperature detection module is greatly reduced, and the effective area of the memory chips will not be affected.

Further, the processing unit 112 includes multiple switches Sx, and the switches Sx are electrically connected with the temperature detection units 111 to select the temperature detection unit 111 with a signal needing to be processed by the processing unit 112. Specifically, when the switches are closed, the temperature detection units 111 are electrically connected with the processing unit 112, and when the switches are opened, the electrical connection between the temperature detection units 111 and the processing unit 112 is released. In the present embodiment, the temperature detection units 111 are diodes. Positive terminals of the diodes are electrically connected with the switches Sx, and negative terminals of the diodes are electrically connected with a grounding terminal VSS. The diode is sensitive to temperature. As the temperature of the ambient environment of the diode changes, the current of the diode changes, so that the temperature of the ambient environment may be measured.

Preferably, the switches Sx correspond to the temperature detection units 111 one to one. That is, one switch is electrically connected with one temperature detection unit 111 to realize an accurate control. Specifically, in the present embodiment, four temperature detection units 111 are provided, and the processing unit 112 accordingly includes four switches S1 to S4. Herein, each of the four switches is electrically connected with one temperature detection unit 111 to control the electrical connection between the temperature detection unit 111 corresponding to the switch and the processing unit 112.

For example, when the electrical signal of the temperature detection unit 111 corresponding to the switch S1 needs to be processed, the switch S1 is closed, and the other switches are opened, so that the temperature detection unit 111 corresponding to the switch S1 is electrically connected with the processing unit 112 to realize processing of the signal. When the electrical signal of the temperature detection unit 111 corresponding to the switch S2 needs to be processed, the switch S2 is closed, and the other switches are opened, so that the temperature detection unit 111 corresponding to the switch S2 is electrically connected with the processing unit 112 to realize processing of the signal. When the electrical signal of the temperature detection unit 111 corresponding to the switch S3 needs to be processed, the switch S3 is closed, and the other switches are opened, so that the temperature detection unit 111 corresponding to the switch S3 is electrically connected with the processing unit 112 to realize processing of the signal. When the electrical signal of the temperature detection unit 111 corresponding to the switch S4 needs to be processed, the switch S4 is closed, and the other switches are opened, so that the temperature detection unit 111 corresponding to the switch S4 is electrically connected with the processing unit 112 to realize processing of the signal. Further, continuing to refer to FIG. 2, in the present embodiment, the processing unit 112 further includes a fixed resistor Ra and an A/D conversion module 1121.

The fixed resistor Ra has a first terminal and a second terminal. The first terminal is electrically connected with the power source Vtemp, and the second terminal is electrically connected with the switches Sx. The A/D conversion module 1121 has an input terminal and an output terminal, the input terminal is electrically connected with the second terminal of the fixed resistor Ra, the output terminal is configured to output digital signals, and the A/D conversion module 1121 is configured to convert analog signals of the second terminal of the fixed resistor Ra into digital signals.

The A/D conversion module 1121 includes a resistor unit and multiple comparing units Px.

The resistor unit has a first terminal and a second terminal. The first terminal of the resistor unit is electrically connected with a power source. The resistor unit and the temperature detection unit 111 may use the same power source, or may use different power sources. For example, when the A/D conversion module 1121 is disposed in the memory chip 100, the first terminal of the resistor unit and the temperature detection unit 111 may use the same power source Vtemp; and when the A/D conversion module 1121 is disposed in the control chip 120, the first terminal of the resistor unit and the temperature detection unit 111 may use different power sources, in which the resistor unit may use a power source VDD. The second terminal of the resistor unit is electrically connected with the grounding terminal VSS. The resistor unit has multiple leading-out terminals Ax, and voltages of the leading-out terminals Ax are different from each other.

In the present embodiment, the resistor unit includes multiple sub-resistors Rx connected in series, and the numbers of the sub-resistors Rx between respective leading-out terminals Ax of the resistor unit and the second terminal of the resistor unit are different from each other, so that the voltages for the leading-out terminals Ax are different. For example, a leading-out terminal A1 is spaced from the second terminal of the resistor unit by a sub-resistor R1, and a leading-out terminal A2 is spaced from the second terminal of the resistor unit by sub-resistors R1 and R2, so that the voltage of the leading-out terminal A1 and the voltage of the leading-out terminal A2 are different.

The number of the sub-resistors Rx between respective leading-out terminals Ax of the resistor unit and the second terminal of the resistor unit is progressively increased by a preset numerical value. The preset numerical value may be a fixed value or a variable numerical value. Referring to FIG. 2, in the present embodiment, the number of the sub-resistors Rx between respective leading-out terminals Ax of the resistor unit and the second terminal of the resistor unit is progressively increased by a fixed value of one. In other embodiments of the disclosure, the number may also be progressively increased by a fixed value of two and the like. When the preset numerical value is a variable numerical value, the preset numerical value has a changing trend. The changing trend is set according to a voltage increase amplitude of the leading-out terminal Ax. For example, when the voltage increase amplitude of the leading-out terminal Ax is increasing, the changing trend of the preset numerical value is increasing; when the voltage increase amplitude of the leading-out terminal Ax is decreasing, the changing trend of the preset value is decreasing; and when the voltage increase amplitude of the leading-out terminal Ax is first increasing and then decreasing, the changing trend of the preset numerical value is first increasing and then decreasing.

Further, the resistance values of the sub-resistors Rx are the same or different, so that the voltage increase amplitude changes between the leading-out terminals Ax are consistent or inconsistent with each other. When the resistance values of the sub-resistors Rx are the same, the pattern layout difficulty may be reduced, and the pattern layout is simple and easy to implement, which facilitates manufacturing.

Signals of the input terminal of the A/D conversion module serve as input signals of the comparing units Px. That is, analog signals output by the temperature detection units serve as input signals of the comparing units Px. Signals of the multiple leading-out terminals Ax of the resistor unit respectively serve as reference signals of the multiple comparing units Px. The leading-out terminals Ax correspond to the comparing units Px one to one. For example, a signal of the leading-out terminal A1 serves as a reference signal of the comparing unit P1, a signal of the leading-out terminal A2 serves as a reference signal of the comparing unit P2. By analogy, the leading-out terminals Ax correspond to the comparing units Px one to one. The comparing units Px output digital signals. According to the digital signals output by the comparing units Px, the temperature of the memory chip 100, detected by the temperature detection unit 111, may be obtained.

When the number of the sub-resistors Rx between respective leading-out terminals Ax of the resistor unit and the second terminal of the resistor unit is progressively increased by a variable preset numerical value, the voltages of the leading-out terminals Ax are changed unevenly, to cause the reference signals of the multiple comparing units Px to be changed unevenly, so that in different voltage regions, the increase amplitudes of the reference signals of the comparing units Px are different, and thus the measurement accuracy of the voltage regions can be changed. Specifically, for the voltage region that needs to be accurately measured, the preset numerical value is changed in a small amplitude, to cause the increase amplitude of the reference signal to be small. In this case, the number of signal sampling points can be increased, and then the measurement accuracy of this region can be improved. For the voltage region that does not need to be accurately measured, the preset numerical value is changed in a large amplitude, to cause the increase amplitude of the reference signal to be large. In this case, the number of signal sampling points can be reduced, and then the measurement efficiency can be improved. For example, in an embodiment of the disclosure, when the voltage of voltage region that needs to be accurately measured is ranged from 1.2 V to 1.7 V, and the corresponding reference signal range is 1.2 V to 1.7 V, in the voltage region in which the voltage is 1.2 V to 1.7 V, the increase amplitude of the preset numerical value is small, for example, the increase amplitude of the preset numerical value is 1, so that the increase amplitude of the reference signal is 0.1 V. In this case, the number of sampling points in this voltage region may be increased, and thus the measurement accuracy can be improved. In the voltage region in which the voltage is less than 1.2 V and greater than 1.7 V, the increase amplitude of the preset numerical value is large, for example, the increase amplitude of the preset value is 3, so that the increase amplitude of the reference signal is 0.3 V. In this case, by appropriately reducing the number of sampling points, the measurement efficiency can be improved.

Further, the A/D conversion module 1121 includes an output unit 1122. The output unit 1122 is connected with the comparing units Px and is configured to output the digital signals. Further, in the present embodiment, the A/D conversion module 1121 includes an encoding unit EEC. The encoding unit EEC receives and encodes the digital signals output by the comparing units Px, the formed signals are input into the output unit 1120, and the output unit 1122 outputs the encoded digital signals.

In the present embodiment, the processing unit 112 further includes an adjustable resistance unit Rb configured to calibrate the temperature detection unit 111. The adjustable resistance unit 111 has a first terminal and a second terminal. The first terminal of the adjustable resistance unit Rb is electrically connected with the grounding terminal VSS, and the second terminal of the adjustable resistance unit Rb is electrically connected with the second terminal of the fixed resistor Ra. The resistance value of the adjustable resistance unit Rb may be changed. For example, the resistance value of the adjustable resistance unit Rb may be changed through the control of the control chip 120, to adjust the voltage of the output terminal of the temperature detection unit 111, thereby realizing the calibration of the temperature detection unit 111.

In the present embodiment, one end of the switch Sx is electrically connected with the temperature detection units 111, and another end of the switch is connected with the adjustable resistance unit Rb. That is, the temperature detection units 111 and the adjustable resistance unit Rb are respectively connected to two ends of the switch Sx. In another embodiment of the disclosure, both the adjustable resistance unit Rb and the temperature detection units 111 are connected to the same end of the switch Sx. That is, both the adjustable resistance unit Rb and the temperature detection units 111 are electrically connected with one end or another end of the switch Sx. When the switch Sx is closed, the data of the temperature detection unit 111 is processed by the processing unit 112. When the switch Sx is opened, the processing unit 112 does not process the data of the temperature detection unit 111.

Figure 4:
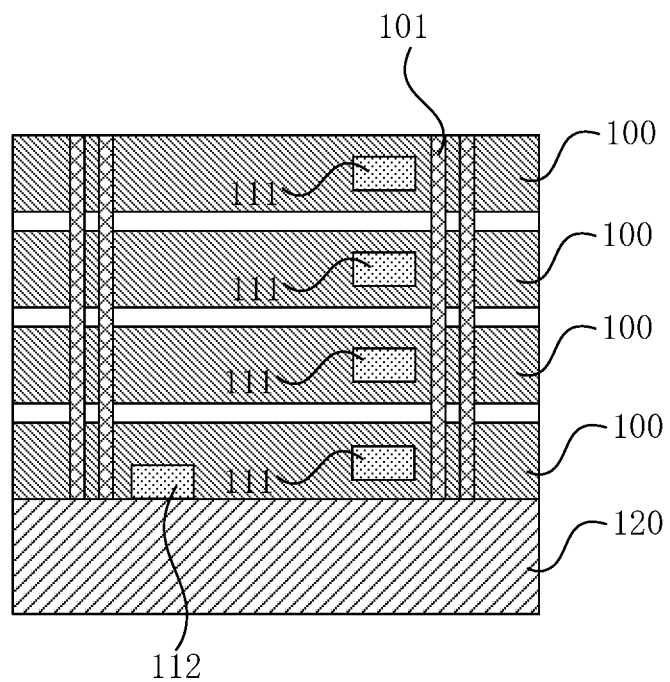
FIG. 4 is a schematic structural diagram of a semiconductor device according to a third embodiment of the disclosure.

The processing unit 112 is disposed on the control chip 120 or disposed on one of the memory chips 100. In the present embodiment, referring to FIG. 1, the processing unit 112 is disposed on the control chip 120. In other embodiments of the disclosure, the processing unit 112 is disposed on one of the memory chips 100. For example, FIG. 4 is a schematic structural diagram of a semiconductor device according to a third embodiment of the disclosure. In the third embodiment, the processing unit 112 is disposed on the bottommost memory chip 100.

Figure 5:
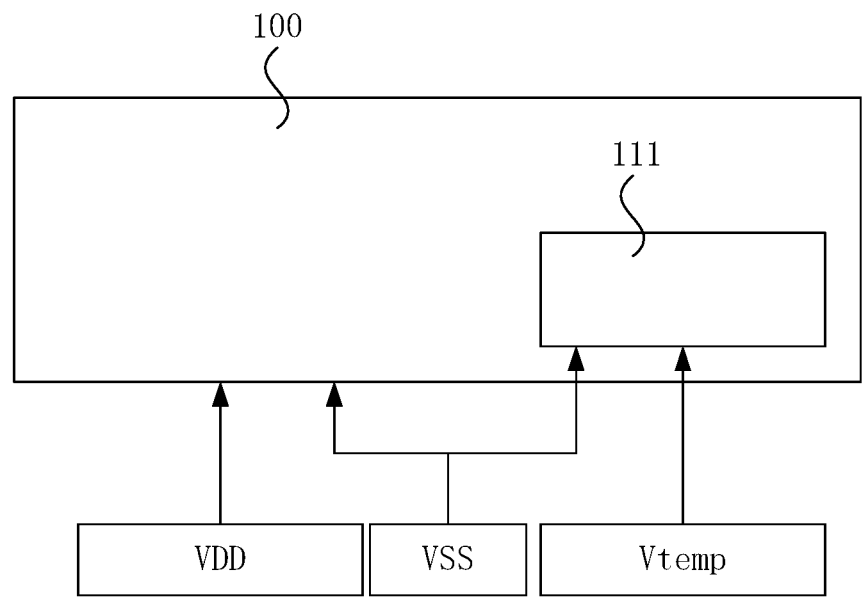
FIG. 5 is a schematic diagram of electrical connection of the semiconductor device according to the first embodiment of the disclosure.

Further, the temperature detection unit 111 and the memory chip 100 are powered by different power sources. FIG. 5 is a schematic diagram of electrical connection of the semiconductor device according to the first embodiment of the disclosure. Referring to FIG. 5, the temperature detection unit 111 is powered by a power source Vtemp, and the memory chip 100 is powered by a power source VDD. The grounding terminal VSS, the power source VDD and the power source Vtemp are provided by the control chip 120. Since the temperature detection unit 111 and the memory chip 100 are powered by different power sources, the power supply of the temperature detection unit 111 and the power supply of the memory chip 100 may be independently controlled, so as to realize the starting of the temperature detection unit 111 and of the memory chip 100 at different times.

Therefore, in the disclosure, the starting of the temperature detection unit 111 and the starting of the memory chip 100 may be controlled respectively. That is, the starting of the temperature detection unit 111 is not affected by whether the memory chip 100 is started or not, and thus the detection of the temperature of the memory chip 100 is not affected by whether the memory chip 100 is started or not, so as to provide a reference for starting and running of the memory chip 100, thereby preventing the memory chip 100 from starting or running at a low temperature, and improving the stability of the memory chip 100.

As mentioned above, the temperature has a great influence on the performance of the memory chip 100, especially when the memory chip 100 is started. When the memory chip 100 is started at a low temperature, the time for writing data into the memory chip 100 will change (such as increase), which will affect the writing stability of the memory chip 100. Thus, the temperature of the memory chip needs to be measured before the memory chip 100 is started, so that the memory chip 100 may be started within a suitable temperature.

Therefore, in the disclosure, the power supply of the temperature detection unit 111 is earlier than the power supply of the memory chip 100. That is, the temperature detection unit 111 has been started before the memory chip 100 is started, so that a temperature of the memory chip before the memory chip 100 is started may be obtained to provide a reference for starting of the memory chip 100. A power supply time difference between the temperature detection unit 111 and the memory chip 100 depends on a temperature change rate of the memory chip 100. When the temperature change rate of the memory chip 100 is large and the time for the memory chip 100 to reach the preset temperature is short, the power supply time difference between the temperature detection unit 111 and the memory chip 100 is small. When the temperature change rate of the memory chip 100 is small and the time for the memory chip 100 to reach the preset temperature is long, the power supply time difference between the temperature detection unit 111 and the memory chip 100 is large.

Further, referring to FIG. 5, the temperature detection unit 111 shares the same grounding terminal VSS with the memory chip 100, which has the advantages that on one hand, the leakage current of the memory chip 100 in a non-starting stage may not be increased, and on the other hand, the number of pins may be reduced to save the space.

Further, a Through-Silicon-Via (TSV) interconnect structure 101 is formed in the memory chip 100. The memory chip 100 is electrically connected with the control chip 120 through the TSV interconnect structure 101 and the temperature detection unit 111 is electrically connected with the processing unit 112 through the TSV interconnect structure 101. Moreover, the memory chip 100 is electrically connected with the grounding terminal VSS and the power source VDD through the TSV interconnect structure 101 and the temperature detection unit 111 is electrically connected with the power source Vtemp and the grounding terminal VSS through the TSV interconnect structure 101.

Specifically, referring to FIG. 1, in the first embodiment, when multiple memory chips 100 are stacked on each other, the respective memory chips 100 may be connected with the control chip 120 through different TSV interconnect structures. When multiple temperature detection units 111 are provided, there may be a case where respective temperature detection units 111 are connected with the processing unit 112 through different TSV interconnect structures, and there may also be a case where the multiple temperature detection units 111 are connected with the processing unit 112 through a same TSV interconnect structure. It can be understood that the memory chip 100 and the temperature detection unit 111 are connected with power sources through different TSV interconnect structures, so that the temperature detection unit 111 and the memory chip 100 may be powered by different power sources. Further, the power supply of the multiple temperature detection units 111 may also share the same TSV interconnect structure.

In other embodiments, the memory chip 100 and the temperature detection unit 111 may also be electrically connected with the control chip 120 and the processing unit 112 through metal leads (formed by a lead bonding process).

Figure 6:
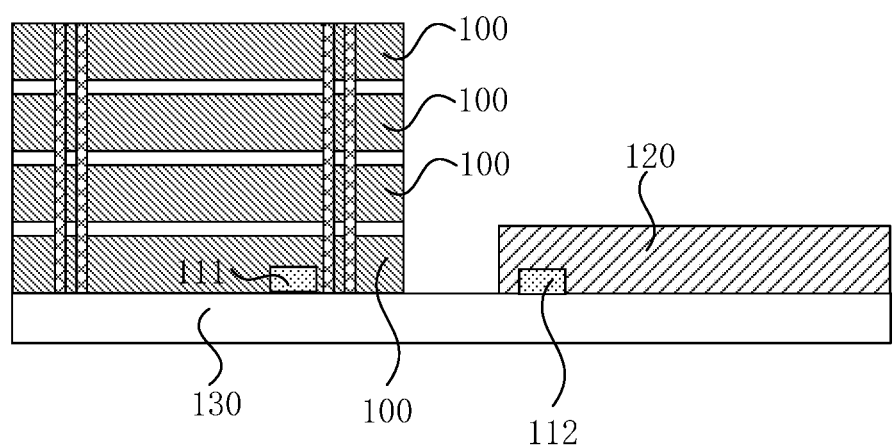
FIG. 6 is a schematic structural diagram of a semiconductor device according to a fourth embodiment of the disclosure.

Continuing to refer to FIG. 1, the multiple memory chips 100 are stacked on the control chip 120 sequentially, and the control chip 120 is bonded with the bottommost memory chip 100 in the stack. In another embodiment of the disclosure, for example, referring to FIG. 6, which is a schematic structural diagram of a semiconductor device according to a fourth example of the disclosure, the semiconductor device further includes a circuit substrate 130, in which a connecting line (not shown in the figure) is provided. Herein, both the memory chip 100 and the control chip 120 are located on the circuit substrate 130, and the memory chip 100 is connected with the control chip 120 through the connecting line in the circuit substrate 130. In the present embodiment, the temperature detection unit 111 is disposed in the memory chip 100, and the processing unit 112 is disposed in the control chip 120. The circuit substrate 130 includes, but is not limited to, a Printed Circuit Board (PCB).

The semiconductor device of the disclosure uses the temperature detection module to detect the temperatures of the memory chips. When the temperature detected by the temperature detection module reaches the set threshold, or after the temperature of the memory chip 100 reaches the set threshold, the memory chip is started. The temperature detected by the temperature detection module provides a reference for starting and running of the memory chip, thereby preventing the memory chip from starting and running at a low temperature, shortening the writing time, and improving the writing stability of the memory chip.

When the memory chip 100 is heated in a low-temperature environment, the temperature of the memory chip 100 may be quickly increased, thereby accelerating the starting of the memory chip 100. Therefore, the control chip 120 of the disclosure may also be started before the memory chip 100 is started, and the control chip 120 uses the heat generated by itself after starting, to heat the memory chip 100, so as to quickly increase the temperature of the memory chip 100.

After the control chip 120 is started, the control chip 120 controls the temperature detection unit 111 to start, so as to detect the temperature of the memory chip 100. The temperature detection unit 111 may also transmit the detected temperature to the control chip 120 to serve as data of the control chip 120.

The control chip 120 may determine whether the temperature detected by the temperature detection unit 111 reaches a set threshold, and when the temperature detected by the temperature detection unit 111 reaches the set threshold, the control chip 120 controls the memory chip 100 to start.

In the case that one temperature detection unit 111 detects the temperatures of multiple memory chips 100, the control chip 120, in responsive to determining that the temperature detected by the temperature detection unit 111 reaches the set threshold, first controls the memory chip 100 closest to the control chip 120 to start, and then controls the other memory chips 100 above the memory chip 100 closest to the control chip to start sequentially.

In the case that the temperature detection units 111 correspond to the memory chips 100 one to one, the control chip 120, in responsive to determining that the temperature detected by a certain temperature detection unit 111 reaches the set threshold, controls the memory chip 100 corresponding to the temperature detection unit 111 to start. Specifically, the stack as shown in FIG. 1 includes four memory chips 100, and each of the memory chips 100 is correspondingly provided with one temperature detection unit 111, so that each temperature detection unit 111 detects the temperature of the corresponding memory chip 100 to obtain four temperature detection values. The control chip 120 sequentially determines whether the temperatures detected by the four temperature detection units 111 reach the set threshold. When the temperature detected by a certain temperature detection unit 111 reaches the set threshold, the control chip 120 controls the memory chip corresponding to the temperature detection unit 111 to start. For example, when the temperature detected by the temperature detection unit 111 in the bottommost memory chip 100 in the stack first reaches the set threshold, the control chip 120 first controls the bottommost memory chip 100 in the stack to start. Subsequently, when the temperature detected by the temperature detection unit 111 corresponding to a second memory chip 100 from the bottommost memory chip in the stack also reaches the set threshold, a control unit 301 controls the second memory chip 100 from the bottommost memory chip in the stack to start. The starting of the memory chips 100 in the upper two layers may be implemented by analogy.

When a semiconductor device is provided with multiple memory chips 100, the above-mentioned control structure and control mode may further improve the accuracy of the start timing of each of the memory chips 100, and may further shorten the writing time for writing data into each of the memory chips 100 in a low-temperature environment, thereby further improving the writing stability of each of the memory chips 100.

When the semiconductor device of the disclosure works in a low-temperature environment, the temperature of the memory chip 100 may rise to the set threshold through the control chip 120, so as to prevent bit lines, word lines and metal connecting lines (metal contact parts) in the memory chip 100 from increasing in resistance due to too low ambient temperature, thereby shortening the writing time for writing data into the memory chip in a low-temperature environment, and improving the writing stability of the memory chip. The set threshold may be set in the control chip 120, and the specific value of the set threshold may be set according to actual needs or experiences.

In another embodiment, the control chip 120 may be provided with an additional heating circuit (not shown in the figures). The heating circuit is configured to heat the memory chip 100. Before or after the control chip 120 heats the memory chip 100, the control chip 120 determines whether the temperature of the memory chip 100, detected by the temperature detection unit 111, reaches the set threshold or not. When the temperature does not reach the set threshold, the control chip 120 controls the heating circuit to heat the memory chip 100. When the temperature reaches the set threshold, the control chip 120 controls the heating circuit to stop heating the memory chip 100. In this way, an accurate control of the heating process can be achieved, thereby keeping the temperature of the memory chip 100 near the set threshold, preventing the temperature of the memory chip 100 from being too high or too low, and enabling the writing time of the memory to be kept shorter all the time.

The above embodiments are only the preferred implementation modes of the disclosure. It is noted that those of ordinary skill in the art can make several improvements and modifications without departing from the principles of the disclosure, and these improvements and modifications should also be regarded as falling within the protection scope of the disclosure.

The invention claimed is:

1. A semiconductor device, comprising a plurality of memory chips and a temperature detection circuit, wherein the temperature detection circuit comprises:
 a plurality of temperature detectors disposed on at least part of the memory chips to detect temperatures of the at least part of the memory chips; and
 a processor, wherein the plurality of temperature detectors share the processor with each other, and the processor is configured to process a signal of at least one of the temperature detectors,
 wherein a power supply of the temperature detectors and a power supply of the memory chips are implemented by different power sources, and
 wherein the power supply of the temperature detectors is earlier than the power supply of the memory chips.

2. The semiconductor device of claim 1, wherein the processor comprises a plurality of switches, and the switches are electrically connected with the temperature detectors to select a temperature detector with a signal needing to be processed by the processor.

3. The semiconductor device of claim 2, wherein the switches correspond to the temperature detectors one to one.

4. The semiconductor device of claim 2, wherein the processor comprises a fixed resistor, and wherein the fixed resistor has a first terminal electrically connected with a power source and a second terminal connected with the switches.

5. The semiconductor device of claim 4, wherein the processor further comprises an Analog/Digital (A/D) conversion circuit, and wherein the A/D conversion circuit has an input terminal electrically connected with the second terminal of the fixed resistor and an output terminal configured to output digital signals, and the A/D conversion circuit is configured to convert analog signals of the second terminal of the fixed resistor into digital signals.

6. The semiconductor device of claim 5, wherein the A/D conversion circuit comprises:
 a resistor set, wherein the resistor set has a first terminal electrically connected with the power source and a second terminal electrically connected with a grounding terminal, and the resistor set has a plurality of leading-out terminals, voltages of the leading-out terminals being different from one another; and
 a plurality of comparators, wherein signals of the input terminal of the A/D conversion circuit serve as input signals of the comparators, signals of the plurality of leading-out terminals of the resistor set respectively serve as reference signals of the plurality of comparators, and the comparators output digital signals.

7. The semiconductor device of claim 6, wherein the A/D conversion circuit further comprises an encoder, and the encoder receives and encodes output signals of the comparators.

8. The semiconductor device of claim 6, wherein the A/D conversion circuit further comprises an output device, the output device being connected with the comparators to output the digital signals.

9. The semiconductor device of claim 6, wherein the resistor set comprises a plurality of sub-resistors connected in series, and the numbers of the sub-resistors between respective leading-out terminals of the resistor set and the second terminal of the resistor set are different from each other, so that the voltages of the respective leading-out terminals are different from each other.

10. The semiconductor device of claim 9, wherein resistance values of the sub-resistors are the same or different.

11. The semiconductor device of claim 4, wherein the temperature detectors are diodes, and positive terminals of the diodes are electrically connected with the switches and negative terminals of the diodes are electrically connected with a grounding terminal.

12. The semiconductor device of claim 11, wherein the processor further comprises an adjustable resistor, and the adjustable resistor has a first terminal electrically connected with the grounding terminal and a second terminal electrically connected with the second terminal of the fixed resistor.

13. The semiconductor device of claim 1, wherein the temperature detectors correspond to the memory chips one to one, and each of the memory chips is provided with one of the temperature detectors.

14. The semiconductor device of claim 1, wherein the semiconductor device further comprises a control chip, and the memory chips and the temperature detection circuit are electrically connected with the control chip.

15. The semiconductor device of claim 14, wherein the processor is disposed on the control chip or disposed on one of the memory chips.

16. The semiconductor device of claim 14, wherein the plurality of memory chips are sequentially stacked upward on the control chip.

17. The semiconductor device of claim 14, wherein the semiconductor device further comprises a circuit substrate, a connecting line is provided in the circuit substrate, both the memory chips and the control chip are located on the circuit substrate, and the memory chips are connected with the control chip through the connecting line in the circuit substrate.

18. The semiconductor device of claim 14, wherein the control chip is configured to heat the memory chips before the memory chips are started and to determine whether the temperatures detected by the temperature detectors reach a set threshold, and wherein the control chip is configured to control the memory chips to start, when the temperatures detected by the temperature detectors reach the set threshold.

19. The semiconductor device of claim 1, wherein the temperature detectors share a same grounding terminal with the memory chips.

* * * * *